United States Patent

Sekiguchi et al.

Patent Number: 6,150,248
Date of Patent: Nov. 21, 2000

[54] METHOD FOR FABRICATING SEMICONDUCTOR DEVICE

[75] Inventors: Mitsuru Sekiguchi, Kyoto; Shinichi Ogawa, Osaka; Kikuko Tsutsumi, Osaka; Tatsuo Sugiyama, Osaka, all of Japan

[73] Assignee: Matsushita Electronics Corporation, Osaka, Japan

[21] Appl. No.: 09/102,383

[22] Filed: Jun. 22, 1998

[30] Foreign Application Priority Data

Jun. 24, 1997 [JP] Japan .................................. 9-166989
Jun. 1, 1998 [JP] Japan ................................ 10-000574

[51] Int. Cl.$^7$ ........................ H01L 21/3205; H01L 21/44
[52] U.S. Cl. ........................ 438/592; 438/533; 438/682
[58] Field of Search ................................ 438/592, 682, 438/533

[56] References Cited

U.S. PATENT DOCUMENTS 5,834,368 11/1998 Kawaguchi et al. .................... 438/621

FOREIGN PATENT DOCUMENTS 62-042520 2/1987 Japan .

OTHER PUBLICATIONS

La Via., et al., "Electrical Characterization of Ultra–Shallow Junctions Formed by Diffusion from a CoSi2 Diffusion Source", Proc. of Mat. Res. Soc. Symp., vol. 427, pp. 493–498.

A.C. Berti, et al., "A Manufacturable Process for the Formation of Self Aligned Cobalt Silicide in a Sub Micrometer CMOS Technology", Proc. of VMIC Conference, pp. 267–273, Jun. 9–10, 1992.

J.A. Kittl, "Salicides for 0.10 um Gate Lengths: A Comparative Study of One–Step RTP Ti with Mo Doping, Ti with Preamorphization and Co Processes", Symposium on VLSI Technology Digest of Technical Papers, pp. 103–104, 1997.

S. Ogawa et al., "Epitaxial CoSi$_2$ Layer Formation Technology on (100) Si and Its Application for Reduced Leakage, Ultra Shallow p$^+$/n Junction", Extended Abstracts of the 1993 International Conference on Solid State Devices and Materials, Makuhari, pp. 195–197, 1993 no month.

Berti et al, VMCI Conference, pp. 267–273, Jun. 1992.

*Primary Examiner*—John F. Niebling
*Assistant Examiner*—Alexander G. Ghyka
*Attorney, Agent, or Firm*—McDermott, Will & Emery

[57] ABSTRACT

A method for fabricating a semiconductor device including a silicon region and a cobalt silicide film, the cobalt silicide film being in contact with at least a part of the silicon region. The method includes the steps of: doping at least part of the silicon region with boron by setting a doping level of boron in the part at $1 \times 10^{15}$ cm$^{-3}$ or more; depositing a cobalt film over a surface of the silicon region; conducting a first heat treatment for producing a silicidation reaction in a contact region between the cobalt film and the silicon region and thereby forming the cobalt silicide film; selectively removing unreacted portions of the cobalt film that have not been turned into silicide; and conducting a second heat treatment at a temperature higher than a temperature set for the first heat treatment step, thereby inducing a phase transition in the cobalt silicide film. The first heat treatment step is performed within a reducing ambient gas, and the temperature set for the first heat treatment step is in the range from about 400° C. to about 600° C., both inclusive.

18 Claims, 6 Drawing Sheets

METHOD FOR FABRICATING SEMICONDUCTOR DEVICE

BACKGROUND OF THE INVENTION

The present invention relates to a method for fabricating a semiconductor device containing silicide of a metal having positive oxide generation energy larger than the oxide generation energy of silicon.

In a transistor for a silicon LSI, a salicidation process for forming refractory metal silicide over a polysilicon gate and source/drain regions has been suggested in order to reduce the resistance of the polysilicon gate and that of a diffusion layer for the source/drain regions. Among other processes, a cobalt (Co) salicidation process for forming cobalt disilicide ($CoSi_2$) is expected to be effectively applicable as technique that makes it easy to reduce the resistance of a polysilicon gate having a small line width and the resistance of a diffusion layer.

Hereinafter, a conventional Co salicidation process will be described with reference to FIGS. 6A through 6E (see, for example, A. C. Berti et al., Proceedings of IEEE VLSI Multilevel International Conference 1992, p. 267).

First, a transistor structure shown in FIG. 6A is formed. The transistor structure includes: element isolation regions (LOCOS) 3 formed on the surface of a silicon substrate 1; source/drain regions 2 formed in the substrate 1; a gate oxide film 4 covering a channel region; a gate electrode formed on the gate oxide film 4; and insulating sidewall spacers 6 formed on the sides of the gate electrode 5.

Next, after native oxide films on the gate electrode 5 and on the source/drain regions 2 are removed, a cobalt (Co) film 7 and a titanium nitride (TiN) film 8 are sequentially deposited over the entire surface of the substrate 1 by sputtering technique as shown in FIG. 6B.

Subsequently, as shown in FIG. 6C, the substrate 1 is heated in an inert gas (e.g., nitrogen) ambient in accordance with rapid thermal annealing (RTA) technique, thereby conducting a heat treatment at 500° C. for about 60 seconds. The temperature rise rate is set at 10° C./sec. or more. As a result of the heat treatment, reaction is produced between the silicon substrate 1 and the cobalt film 7 and between the gate electrode 5 and the cobalt film 7 whereby cobalt silicide (CoSi) 9 is formed.

The inert gas such as nitrogen has been introduced into a lamp annealer so as to suppress the oxygen concentration in the ambient to a low level. However, 5 ppm or more of oxygen, corresponding to $5 \times 10^{-6}$ pressure of oxygen under atmospheric pressure, unintentionally remains in the annealer. Ti, generally used for salicidation, is less likely to be adversely affected by oxidation, whereas Co is very likely to be oxidized. Thus, Co is oxidized with oxygen at such a low level. In view of this fact, before the heat treatment for salicidation is performed, the cobalt film 7 needs to be covered with the TiN film 8 functioning as an antioxidant film.

Then, as shown in FIG. 6D, the unreacted portions of the Co film 7 and the TiN film 8 are removed by wet etching using a mixture solution of $H_2SO_4$—$H_2O_2$ at 120° C., for example.

Finally, as shown in FIG. 6E, a heat treatment is conducted at 750° C. for about 30 seconds through rapid thermal annealing at 10° C./sec. or more within an inert gas (e.g., nitrogen) ambient. During this process step, the CoSi film 9 further reacts with silicon in the silicon substrate 1 and in the gate electrode 5, thereby forming a $CoSi_2$ (cobalt disilicide) film 10. Since the specific resistance of the $CoSi_2$ film 10 is as low as about 16 μΩcm, resistance reduction is realized in the source/drain regions 2 and the gate electrode 5.

In the Co salicidation process, a CoSi film is firstly formed by conducting the initial rapid thermal annealing at a relatively low temperature of 400° C. to 600° C. The reason is as follows. If a heat treatment is conducted at about 700° C. to try to form a $CoSi_2$ film from the beginning, then the resultant $CoSi_2$ possibly laterally grows on the element isolation regions 3 and the insulating sidewall spacers 6 so as to shortcircuit the source/drain regions 2 and the gate electrode 5.

Recently, it was reported that a $CoSi_2$ film can be formed without causing such an unwanted lateral growth even when such rapid thermal annealing is conducted from the beginning at as high a temperature as 700° C. or more by depositing a Ti film having a thickness of about 2 nm under a cobalt film (see, for example, S. Ogawa et al., Extended Abstracts of International Conference on Solid State Devices and Materials, p. 195, 1993). However, in such a case, it is still considered necessary to cover the surface of the cobalt film with a TiN film or the like during the rapid thermal annealing, in order to suppress the oxidation of the surface of the cobalt film.

The technology illustrated in FIGS. 6A through 6E requires a process step of depositing a TiN film on a cobalt film, which in turn requires to separately provide a Ti target for a sputtering apparatus. However, when the TiN film is sputtered, particles are likely to be generated within the sputtering apparatus. If the number of particles increases within the sputtering apparatus, then the production yield of a semiconductor device ultimately tends to decrease.

Moreover, according to another suggested method (see, for example, K. Inoue et al., IEDEM, p. 445, 1995), a cobalt film is firstly deposited within a sputtering apparatus including a rapid thermal annealing chamber and a semiconductor substrate is moved into the rapid thermal annealing chamber and subjected to a heat treatment without breaking vacuum. In accordance with this method, a $CoSi_2$ film can be formed without depositing a TiN film. However, since this method conducts a heat treatment by moving a semiconductor substrate within vacuum, the processing performance is not high to such an extent as to be appropriately applied for mass production.

In view of the above-mentioned conventional problems, the present invention was made in order to provide a method for fabricating a semiconductor device allowing for a salicidation without covering a metal film with an antioxidant film.

SUMMARY OF THE INVENTION

According to the present invention, a method for fabricating a semiconductor device is provided. The semiconductor device includes a silicon region and a cobalt silicide film. The cobalt silicide film is in contact with at least a part of the silicon region. The method includes the steps of: doping at least part of the silicon region with boron by setting a doping level of boron in the part at $1 \times 10^{15}$ cm$^{-3}$ or more; depositing a cobalt film over a surface of the silicon region; conducting a first heat treatment for producing a silicidation reaction in a contact region between the cobalt film and the silicon region and thereby forming the cobalt silicide film; selectively removing unreacted portions of the cobalt film that have not been turned into silicide; and conducting a second heat treatment at a temperature higher than a temperature set for the first heat treatment step, thereby inducing a phase transition in the cobalt silicide film. The first heat treatment step is performed within a reducing ambient gas, and the temperature set for the first heat treatment step is in the range from about 400° C. to about 600° C., both inclusive.

According to another aspect of the present invention, a method for fabricating a semiconductor device is also provided. The semiconductor device includes a silicide film of a metal having positive oxide generation energy larger than oxide generation energy of silicon. The method includes the steps of depositing a film made of the metal over a surface of a silicon region, and conducting a heat treatment for producing a silicidation reaction between at least part of the metal film and at least part of the silicon region and thereby forming the metallic silicide film. The heat treatment step is conducted within a reducing ambient containing ammonium.

According to still another aspect of the present invention, a method for fabricating a semiconductor device is further provided. The semiconductor device includes a silicide film of a metal having positive oxide generation energy larger than oxide generation energy of silicon. The method includes the steps of: forming a transistor structure, the transistor structure including a substrate, source/drain regions formed in a silicon region in a surface region of the substrate, a channel region interposed between the source region and the drain region in the surface region of the silicon region, a gate insulating film formed over the channel region, a gate electrode formed on the gate insulating film, and insulating sidewalls covering sides of the gate electrode; depositing a cobalt film such that the cobalt film covers an exposed part of the silicon region in the transistor structure; and forming a cobalt silicide film to be self-aligned with and to overlap the source/drain regions and the gate electrode by conducting a heat treatment in an ambient containing ammonium gas with the cobalt film exposed.

BRIEF DESCRIPTION OF THE DRAWINGS

FIG. 3A shows the results where a heat treatment is conducted by using a mixture gas of hydrogen gas and nitrogen gas as an ambient; and FIG. 3B shows the results where a heat treatment is conducted by using nitrogen gas as an ambient.

DETAILED DESCRIPTION OF THE PREFERRED EMBODIMENTS

Hereinafter, preferred embodiments of the present invention will be described with reference to the accompanying drawings.

Embodiment 1

A method for fabricating a semiconductor device in the first embodiment of the present invention will be described with reference to FIGS. 1A through 1E.

Figure 1A:
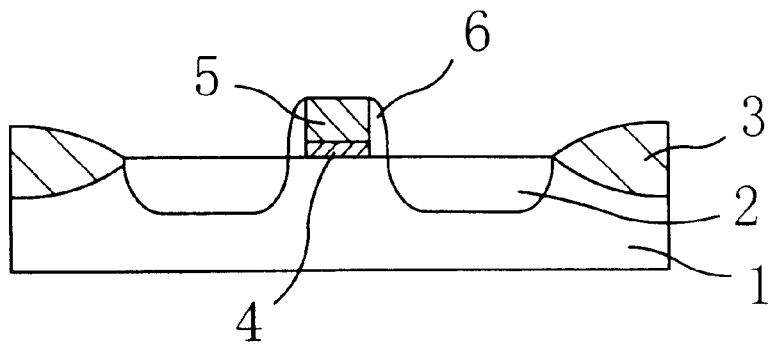
FIGS. 1A to 1E are cross-sectional views illustrating the process steps for fabricating a semiconductor device in the first embodiment of the present invention.

First, a transistor structure shown in FIG. 1A is formed in accordance with a known fabrication method. The transistor structure includes: element isolation regions (LOCOS) 3 formed on the surface of a silicon substrate 1; source/drain regions 2 formed in the substrate 1; a gate oxide film ($SiO_2$ film) 4 covering a channel region; a gate electrode 5 formed on the gate oxide film 4; and insulating sidewall spacers 6 formed on the sides of the gate electrode 5.

It is noted that an insulating substrate supporting a silicon film may be used instead of the silicon substrate 1. This is because the present invention will be suitably applicable to such a case as mounting a highly integrated circuit onto an insulating substrate in a flat panel display and the like.

Also, the element isolation regions 3 are not limited to LOCOS regions, but may be trench isolation regions. The source/drain regions 2 are preferably formed to be self-aligned with the gate electrode 5 by implanting impurity ions into the silicon substrate 1 by the use of the gate electrode 5 and the insulating sidewall spacers 6 as a mask after the electrode 5 and the spacers 6 have been formed. It is also noted that each of the source/drain regions 2 need not be constituted by a single doped layer, but may be a combination of a plurality of doped layers respectively having different doping levels. For example, each of the source/drain regions 2 may include an $n^-$-type relatively lightly doped layer (functioning as an LDD) and $n^+$-type relatively highly doped layer. In such a case, the lightly-doped layer is typically formed by ion implantation technique so as to be self-aligned with the gate electrode 5 before the sidewall spacers 6 are formed. On the other hand, the highly-doped layer is typically formed in a region that is laterally shifted outward from the gate electrode 5 via the insulating sidewall spacers 6 by using ion implantation technique, too.

In this embodiment, the gate electrode 5 is made of polysilicon, and has a line width of about 0.2 μm to about 2.0 μm. An impurity like arsenic is doped into polysilicon.

In FIG. 1A, only one transistor structure is illustrated for the sake of simplicity. However, in actuality, a large number of transistor structures having the same configuration are formed on a single substrate. In this embodiment, at least part of the transistor structures are of P-channel type and the remainder are of N-channel type. The source/drain regions 2 of the P-channel type transistor structure are doped with boron as a p-type impurity and the source/drain regions 2 of the N-channel type transistor structure are doped with arsenic as an n-type impurity. Boron doping is preferably performed by implanting $BF_2$ ions.

Figure 1B:
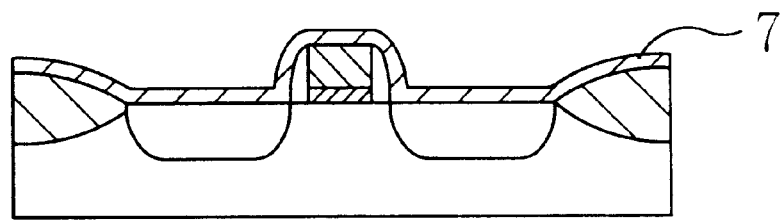

After the transistor structure has been formed, a cobalt film 7 is deposited over the entire surface of the substrate 1 as shown in FIG. 1B. The cobalt film is preferably deposited by sputtering technique using a cobalt target. The thickness of the cobalt film 7 is in the range from about 5 nm to about 15 nm, for example. The parts of the surface regions of the silicon substrate 1, which are in contact with the cobalt film 7, are doped with a p-type or an n-type impurity at a high level. For example, in the source/drain regions of a p-type transistor, boron having a dose of $3\times10^{15}$ $cm^2$ is implanted, while in the source/drain regions of an n-type transistor, arsenic having a dose of $2>10^{15}$ cm$^{-2}$ is implanted. The cobalt film 7 is also in contact with polycrystalline silicon over the top surface of the gate interconnection. Polycrystalline silicon is also doped with a p-type and/or an n-type impurity at a high level. For example, in the gate electrode 5 of a p-type transistor, boron having a dose of $6\times10^{15}$ cm$^{-2}$ is implanted, while in the gate electrode 5 of an n-type transistor, arsenic having a dose of $7\times10^{15}$ cm$^{-2}$ is implanted.

Figure 1C:
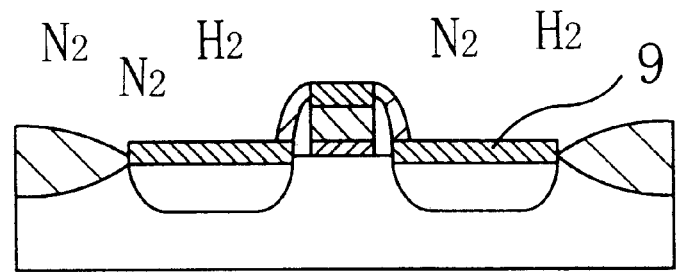

Next, as shown in FIG. 1C, a heat treatment is conducted at 500° C. for about 60 seconds by performing rapid thermal annealing at a rate of 30° C/sec. within nitrogen ambient containing 4% by volume of hydrogen. The temperature rise rate may be set at any value larger than 10° C./sec. As a result of this heat treatment, silicidation reaction proceeds in the contact region between the silicon substrate 1 and the cobalt film 7 and between polysilicon of the gate electrode 5 and the cobalt film 7 whereby a CoSi film 9 is formed. The portions of the cobalt film 7 that are in contact with the element isolation regions 3 and with the insulating sidewall spacers 6 are not turned into silicide, but remain as "unreacted portions".

In this embodiment, an inert gas with 4% by volume of hydrogen added is used as the ambient gas during this heat treatment. Thus, even if the cobalt film 7 is not covered with a TiN film or the like, it is possible to effectively prevent the cobalt film 7 from being oxidized.

Figure 1D:
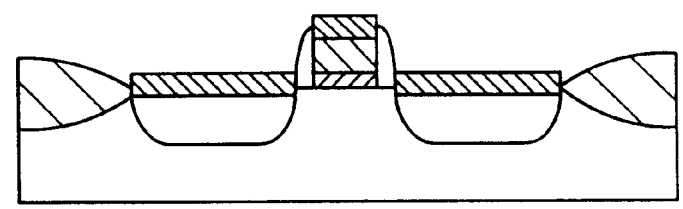

After the heat treatment has been conducted, the unreacted portions of the cobalt film 7 are removed by wet etching using a mixture solution of $H_2SO_4$ and $H_2O_2$ at 120° C., for example, as shown in FIG. 1D.

Figure 1E:
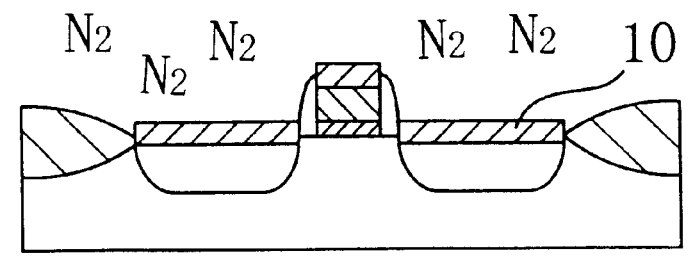

Finally, as shown in FIG. 1E, rapid thermal annealing is performed at a temperature rise rate of 10° C/sec. or more within an inert gas ambient such as nitrogen, thereby conducting a heat treatment at 750° C. for about 30 seconds. During this second heat treatment, the CoSi film 9 further reacts with the silicon substrate 1 and with silicon of the gate electrode 5 so as to be turned into $CoSi_2$ (cobalt disilicide) film 10. As a result, the sheet resistance thereof is further decreased.

Figure 2A:
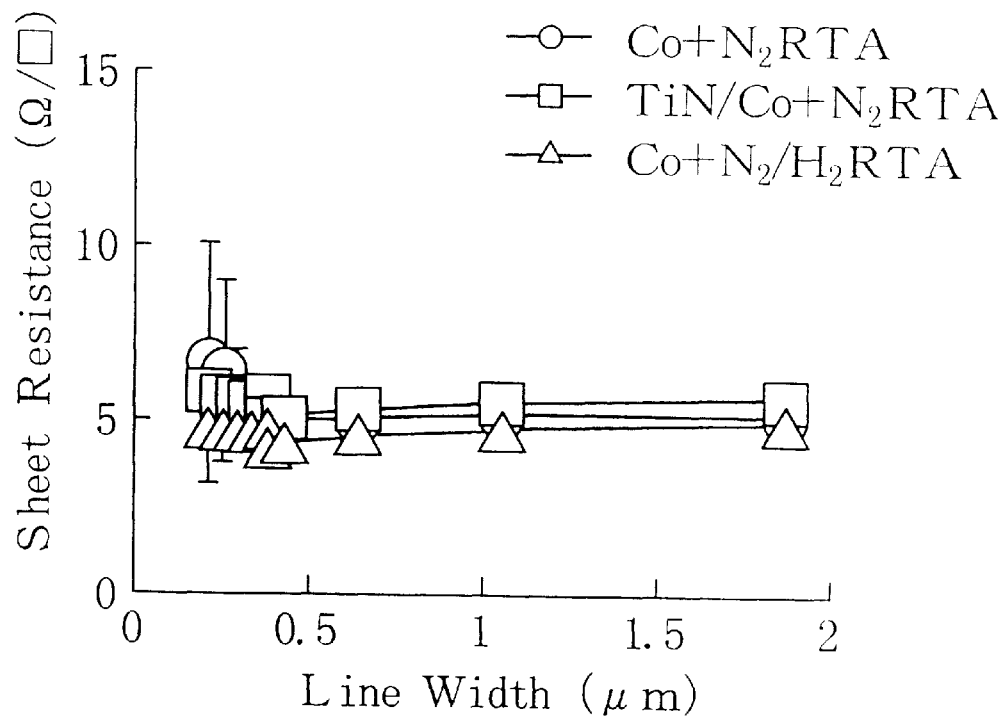
FIGS. 2A and 2B are graphs illustrating the measurement results of sheet resistance of the semiconductor device in the first embodiment.
Figure 2B:
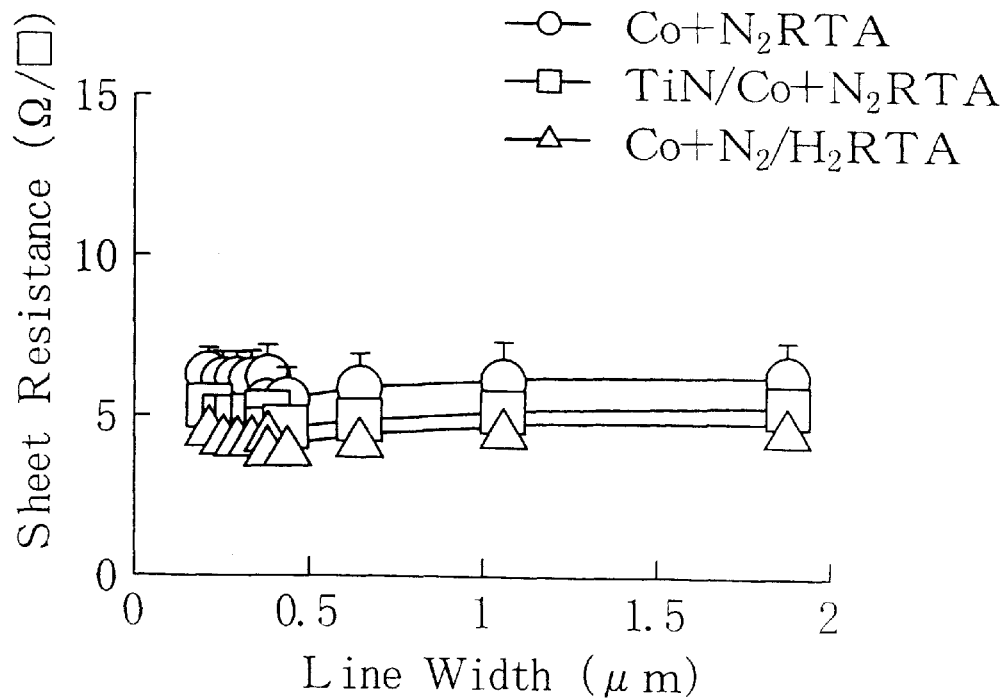

FIGS. 2A and 2B illustrate the sheet resistance of the source/drain regions 2 in which the CoSi layer 10 has been formed by turning the surface region of an n$^+$-type doped layer and the surface region of a p$^+$-type doped layer into silicide, respectively. The concentration of residual oxygen in a lamp annealer used for forming the $CoSi_2$ film 10 is in the range from 5 ppm to 20 ppm. As shown in FIGS. 2A and 2B, if the rapid thermal annealing is performed within 100% nitrogen ambient as in a conventional process, the sheet resistance of the p$^+$-type doped layer is higher and more varied than that of the n$^{30}$-type doped layer. The reasons will be described more fully below.

Figure 3A:
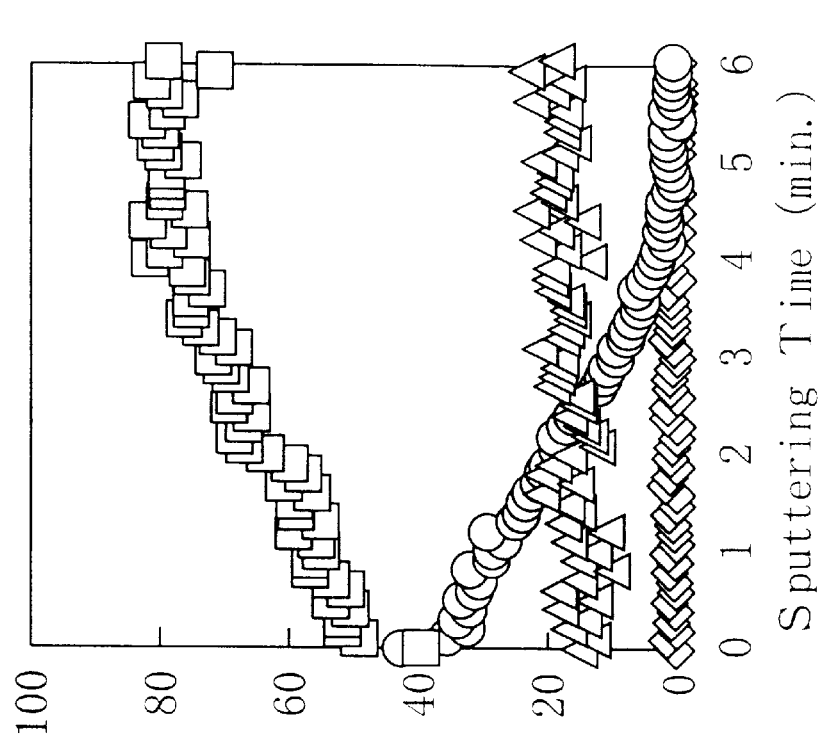
FIGS. 3A and 3B are graphs illustrating the distributions of respective elements (nitrogen, oxygen, cobalt and silicon) in the depth direction
Figure 3B:
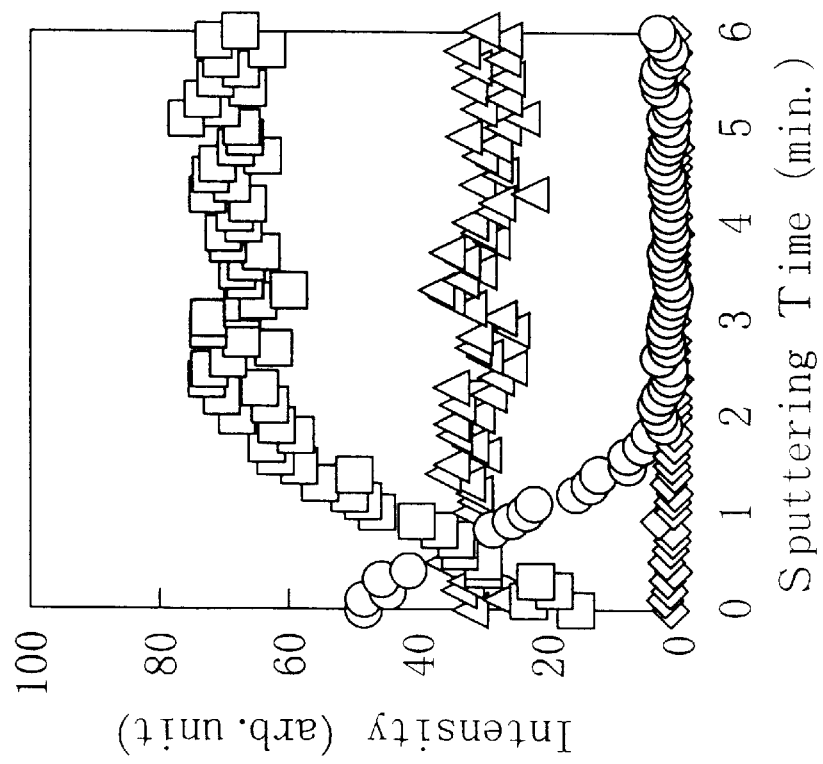

First, FIGS. 3A and 3B will be referred to. FIGS. 3A and 3B illustrate the distributions of respective elements (nitrogen, oxygen, cobalt and silicon) included in the silicide film in the depth direction. The distributions are obtained through XPS measurement. This measurement is performed after the first heat treatment has been conducted where a $CoSi_2$ film is formed through a two-step heat treatment. FIG. 3A shows the results where the heat treatment is conducted by using a mixture gas of hydrogen gas and nitrogen gas as an ambient, while FIG. 3B shows the results where the heat treatment is conducted by using nitrogen gas as an ambient. The conditions for the heat treatment are the same as those of the first rapid thermal annealing mentioned above.

As shown in FIG. 3B, where the hydrogen gas is not contained in the ambient, oxygen is distributed over a wide range from the surface of cobalt silicide to a deep position, and the density of cobalt monotonically decreases from a deep position toward the surface. On the other hand, as shown in FIG. 3A, where the hydrogen gas is contained in the ambient, the distribution of oxygen is substantially restricted to the vicinity of silicide and the density of cobalt abruptly changes in the vicinity of the surface. These results mean the following.

Firstly, if the hydrogen gas is not added to the ambient gas, the oxidation of cobalt proceeds to a sufficient degree even when the heat treatment is conducted at a relatively low temperature of 500° C. for a short period of time of 60 seconds. Secondly, the addition of the hydrogen gas satisfactorily prevents oxide from being formed in the surface of cobalt even when the heat treatment is conducted at a relatively low temperature of 500° C. for a short period of time of 60 seconds. Thirdly, such an oxidation suppression effect can be attained only by adding a small amount of hydrogen gas (volume percentage: 4%) to the ambient gas.

Figure 4A:
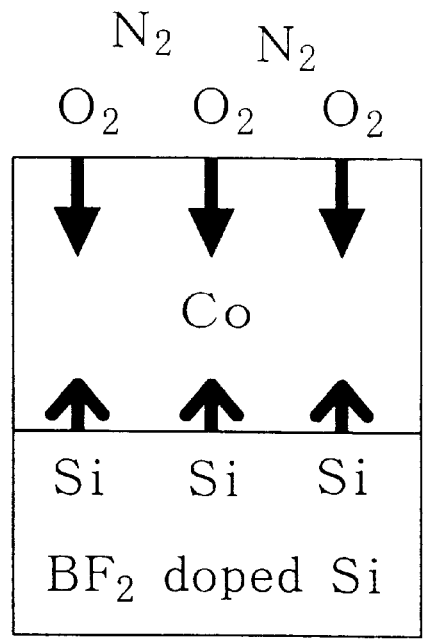
FIG. 4A is a cross-sectional view schematically illustrating how oxidation proceeds in the surface of cobalt, which is turning into silicide, in nitrogen gas.
Figure 4B:
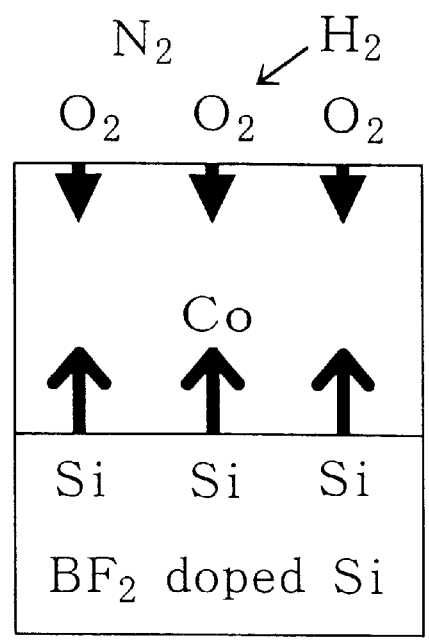
FIG. 4B is a cross-sectional view schematically illustrating how oxidation proceeds in the surface of cobalt, which is turning into silicide, in nitrogen gas with hydrogen gas added.

Next, FIGS. 4A and 4B will be referred to. FIG. 4A schematically illustrates how oxidation proceeds in the surface of cobalt, which is turning into silicide, in nitrogen gas, while FIG. 4B schematically illustrates how oxidation proceeds in the surface of cobalt, which is turning into silicide, in nitrogen gas with hydrogen gas added. In both cases, the silicidation reaction produced from the lower surface of the cobalt film competes with the silicidation reaction produced from the upper surface of the cobalt film. It is known that the silicidation reaction rate decreases if the underlying silicon region is doped with boron. Thus, in the region over the p$^+$-type doped region doped with boron (doping level of boron: $1\times10^{15}$ cm$^{-3}$), the surface oxidation of the cobalt film prevails over the silicidation. However, if hydrogen is added to the ambient gas, the oxidation rate decreases. As a result, the influence of the oxidation on the sheet resistance is reduced.

As can be understood, in this embodiment, even if the silicidation of the cobalt film is delayed by boron (B) doped into the p$^+$-type source/drain regions, the surface oxidation of the cobalt film can be suppressed.

As shown in FIGS. 2A and 2B, if hydrogen is not added, when the width of the n$^+$-type source/drain regions is 1 $\mu$m or less, the sheet resistance thereof is increased and more varied, which results from the surface oxidation of the cobalt film. By contrast, when hydrogen is added, the sheet resistance can be lowered and less varied.

As described above, the addition of 4% by volume of $H_2$ into the ambient gas can produce the same effects as those produced by the deposition of a TiN film as an antioxidant film on a cobalt film. The present invention is applicable particularly effectively when silicidation is performed between silicon doped with boron and a cobalt film.

In this embodiment, nitrogen is used as the inert gas. Alternatively, other gases such as Ar may also be used. Also, instead of performing a two-step heat treatment for silicidation as in this embodiment, the $CoSi_2$ film may be formed by conducting a heat treatment only once. Moreover, in this embodiment, the hydrogen gas is added to the ambient gas only during the first heat treatment. Optionally, the hydrogen gas may also be added to the ambient gas during the second heat treatment.

Embodiment 2

Next, a method for fabricating a semiconductor device in the second embodiment of the present invention will be described with reference to FIGS. 5A to 5E.

Figure 5A:
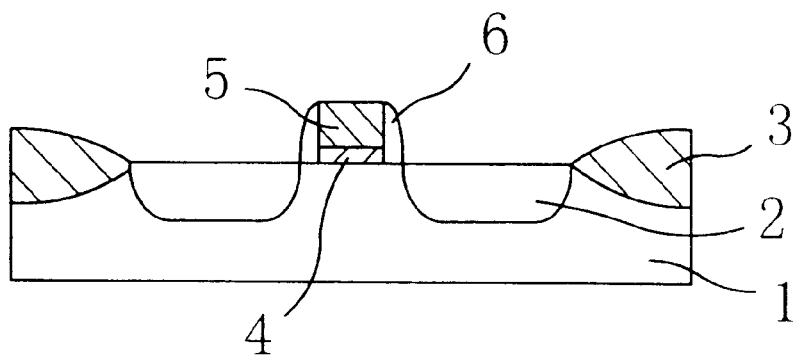
FIGS. 5A to 5E are cross-sectional views illustrating the process steps for fabricating a semiconductor device in the second embodiment of the present invention.

First, a transistor structure shown in FIG. 5A is formed in accordance with a known fabrication method. The transistor structure includes: element isolation regions (LOCOS) 3 formed on the surface of a silicon substrate 1; source/drain regions 2 formed in the substrate 1; a gate oxide film (SiO$_2$ film) 4 covering a channel region; a gate electrode 5 formed on the gate oxide film 4; and insulating sidewall spacers 6 formed on the sides of the gate electrode 5. This transistor structure may be the same as the structure described by reference to FIG. 1A, and may be fabricated by the same method as that described above.

Figure 5B:
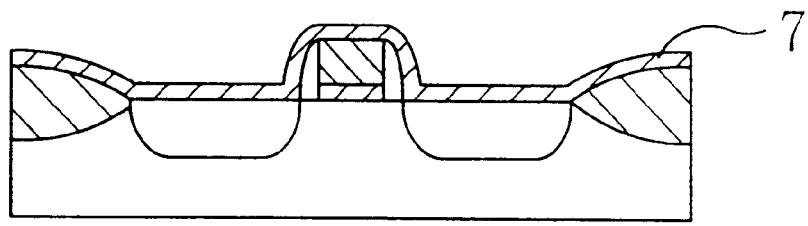

Next, as shown in FIG. 5B, a cobalt film 7 is deposited over the entire surface of the substrate 1 by sputtering technique using a cobalt target. In this embodiment, the thickness of the cobalt film 7 is also preferably in the range from about 5 nm to about 15 nm.

Figure 5C:
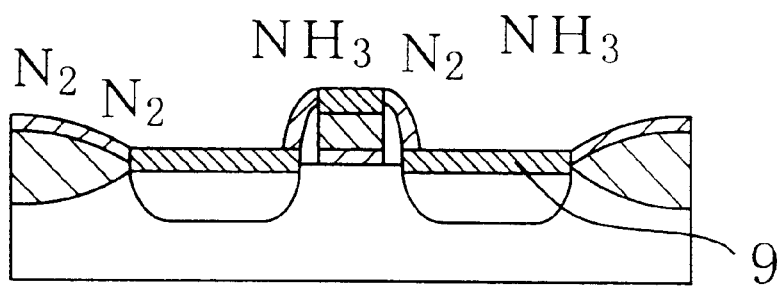

Next, as shown in FIG. 5C, a heat treatment is conducted at 500° C. for about 60 seconds by performing rapid thermal annealing at a rate of 10° C./sec. or more, e.g., 30° C. /sec., within a reducing ambient, i.e., a nitrogen ambient containing 1% by volume of ammonium gas. As a result of this heat treatment, reaction is produced between the source/drain regions 2 and the cobalt film 7 and between the gate electrode 5 and the cobalt film 7 whereby a CoSi film 9 is formed. During this process step, the ammonium gas (NH$_4$) gas is thermally decomposed to generate active hydrogen. The active hydrogen reduces impurity gases such as oxygen gas and water that would otherwise be possibly oxidized in the ambient. As a result, even if the cobalt film 7 is not covered with a TiN film or the like but is left exposed; the oxidation of the cobalt film 7 can be prevented. The ammonium gas is preferably contained at a volume percent of about 0.5% to about 100% with respect to the entire volume.

Figure 5D:
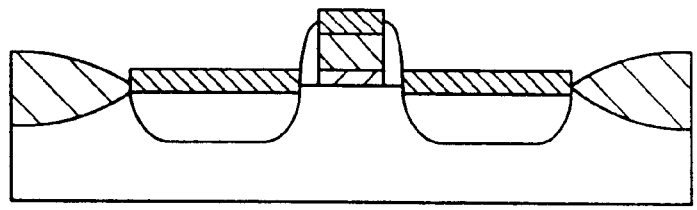

Then, the unreacted portions of the cobalt film 7 are removed by wet etching using a mixture solution of H$_2$SO$_4$ and H$_2$O$_2$ at 120° C., for example, as shown in FIG. 5D.

Figure 5E:
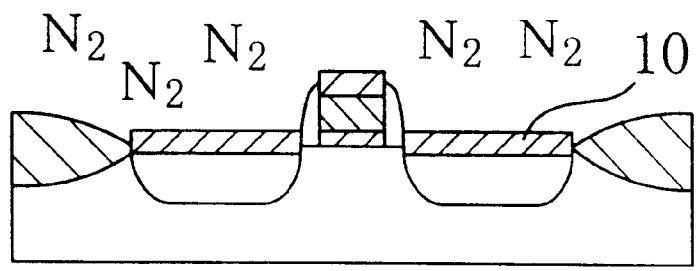
Figure 6A:
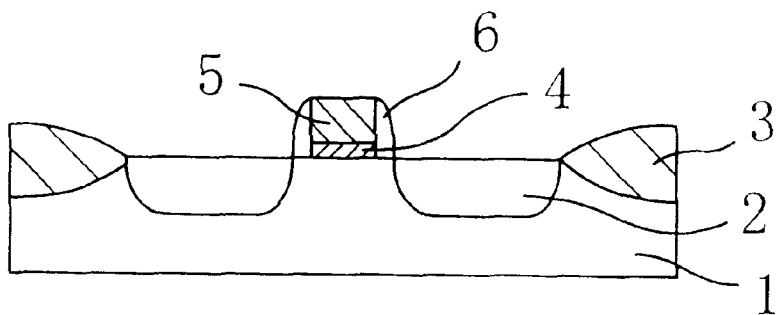
FIGS. 6A to 6E are cross-sectional views illustrating the conventional process steps for fabricating a semiconductor device.
Figure 6B:
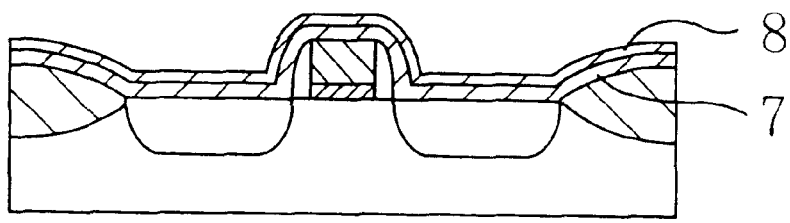
Figure 6C:
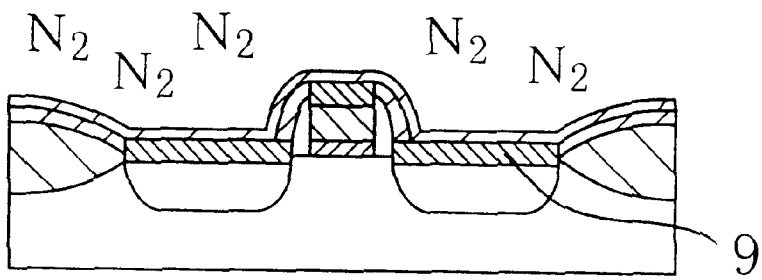
Figure 6D:
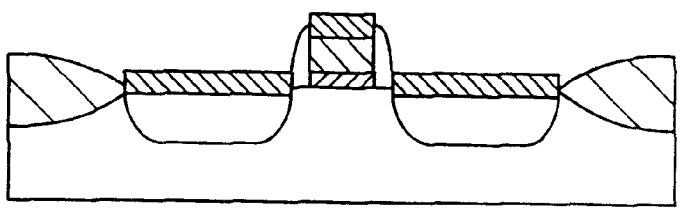
Figure 6E:
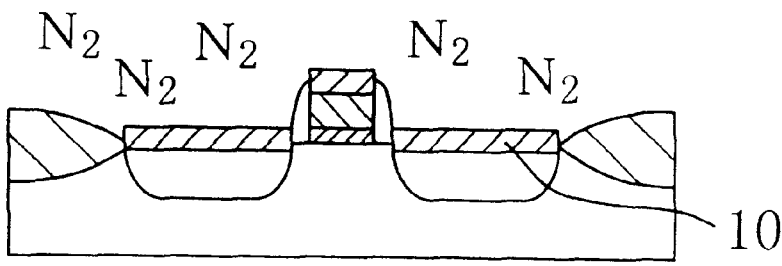

Subsequently, as shown in FIG. 5E, rapid thermal annealing is performed at a temperature rise rate of 10° C./sec. or more within 100% nitrogen ambient, thereby conducting a heat treatment at 750° C. for about 30 seconds. As a result, phase transition occurs to turn the CoSi film 9 into a CoSi$_2$ film 10.

In this embodiment, since 1% of ammonium gas is added to the ambient gas during the heat treatment process for silicidation, the sheet resistance is low and constant even at the minimum line width of 0.1 $\mu$m. Also, the sheet resistance over the p$^+$-type source/drain diffusion layers is not so different from the sheet resistance over the n$^+$-type source/drain diffusion layers.

By using ammonium gas instead of hydrogen gas, the risk of explosion can be substantially eliminated and the costs required for securing safety of equipment and the unit costs per process can be reduced.

In this embodiment, nitrogen is used as the ambient gas for ammonium. Alternatively, other gases such as Ar may also be used. Moreover, in this embodiment, ammonium is added only during the first heat treatment. Optionally, the ammonium gas may also be added to the ambient gas during the second annealing for forming a CoSi$_2$ film.

In the foregoing embodiments, the present invention has been described by employing Co as a metallic material. However, the present invention is also effectively applicable to the process for forming a silicide film of any other metallic material, such as Ta and Hf, having positive oxide generation energy larger than the oxide generation energy of Si, i.e., a material that is less likely to be oxidized than Si.

In the foregoing embodiments, doping to the source/drain regions is performed before silicidation. Alternatively, after the silicidation has been performed, impurity ions may be implanted into a silicide film and silicide may be used as a dopant source. In the latter case, a shallower junction can be formed as compared with a case of implanting impurity ions into the silicon substrate before the silicidation.

In accordance with a method for fabricating a semiconductor device of the present invention, cobalt silicide can be formed without covering a cobalt film with an antioxidant film made of TiN or the like.

In accordance with another method for fabricating a semiconductor device, in forming silicide of a metal having positive oxide generation energy larger than the oxide generation energy of Si, silicide of the metal can be formed without covering the metal with an antioxidant film made of TiN or the like.

What is claimed is:

1. A method for fabricating a semiconductor device, said semiconductor device including a silicon region and a cobalt silicide film, said cobalt silicide film being in contact with at least a part of said silicon region, the method comprising the steps of:

doping at least part of said silicon region with boron by setting a doping level of boron in the part at $1\times10^{15}$ cm$^{-3}$ or more;

depositing a cobalt film over a surface of said silicon region;

conducting a first heat treatment for producing a silicidation reaction in a contact region between said cobalt film and said silicon region and thereby forming said cobalt silicide film;

selectively removing unreacted portions of said cobalt film that have not been turned into silicide; and conducting a second heat treatment at a temperature higher than a temperature set for said first heat treatment step, thereby inducing a phase transition in said cobalt silicide film, wherein said first heat treatment step is performed within a reducing ambient gas with said cobalt film exposed, and wherein the temperature set for said first heat treatment step is in the range from about 400° C. to about 600° C., both inclusive.

2. The method for fabricating a semiconductor device of claim 1, wherein the reducing ambient gas is an inert gas containing hydrogen gas.

3. The method for fabricating a semiconductor device of claim 1, wherein the reducing ambient gas contains ammonium gas.

4. The method for fabricating a semiconductor device of one of claims 1 to 3, wherein said silicon region is included in a single crystalline silicon substrate.

5. The method for fabricating a semiconductor device of one of claims 1 to 3, wherein part of said silicon region is included in a single crystalline silicon substrate, and wherein another part of said silicon region is included with an interconnection provided on said silicon substrate.

6. The method for fabricating a semiconductor device of claim 1, wherein, before the phase transition is induced, said cobalt silicide film is made of CoSi, but after the phase transition has been induced, said cobalt silicide film is made of CoSi$_2$.

7. The method for fabricating a semiconductor device of claim 2, wherein a volume percentage of the hydrogen gas with respect to the entire ambient gas is 4% or less.

8. The method for fabricating a semiconductor device of claim 1, wherein said first heat treatment step is performed by using a lamp annealer.

9. The method for fabricating a semiconductor device of claim 1, wherein, in said first heat treatment step, a temperature of said cobalt film is raised at a rate of 10° C./sec. or more up to the temperature in the range from about 400° C. to about 600° C.

10. A method for fabricating a semiconductor device, said semiconductor device including a silicide film of a metal having positive oxide generation energy larger than oxide generation energy of silicon, the method of comprising the steps of:

depositing a film made of said metal over a surface of a silicon region, and conducting a heat treatment for producing a silicidation reaction between at least part of said metal film and at least part of said silicon region and thereby forming said metallic silicide film, wherein said heat treatment step is conducted within a reducing ambient containing ammonium with said cobalt film exposed.

11. The method for fabricating a semiconductor device of claim 9, wherein, in said heat treatment step, a temperature of said metal film is raised at a rate of 10° C/sec. or more up to a temperature between 400° C. and 700° C.

12. The method for fabricating a semiconductor device of claim 9, further comprising the steps of selectively removing unreacted portions of said metal film that have not been turned into silicide, and conducting another heat treatment for inducing a phase transition in said silicide film at a temperature higher than the temperature between 400° C. and 700° C. of said heat treatment.

13. The method for fabricating a semiconductor device of one of claims 10 and 11, wherein said metal is cobalt.

14. A method for fabricating a semiconductor device, said semiconductor device including a silicide film of a metal having positive oxide generation energy larger than oxide generation energy of silicon, the method comprising the steps of:

forming a transistor structure, said transistor structure including a substrate, source/drain regions formed in a silicon region in a surface region of said substrate, a channel region interposed between said source region and said drain region in the surface region of the silicon region, a gate insulating film formed over said channel region, a gate electrode formed on said gate insulating film, and insulating sidewalls covering sides of said gate electrode;

depositing a cobalt film such that said cobalt film covers an exposed part of the silicon region in said transistor structure; and forming a cobalt silicide film to be self-aligned with and to overlap said source/drain regions and said gate electrode by conducting a heat treatment in an ambient containing ammonium gas with said cobalt film exposed.

15. The method for fabricating a semiconductor device of claim 14, wherein said step of forming said cobalt silicide film comprises a heat treatment step of raising a temperature of said cobalt film up to a temperature between 400° C. and 700° C. at a rate of 10° C./sec. or more.

16. The method for fabricating a semiconductor device of claim 14, wherein said step of forming said cobalt silicide film comprises the steps of:

conducting a first heat treatment to raise a temperature of said cobalt film up to a temperature between 400° C. and 600° C. at a rate of 10° C./sec. or more;

selectively removing unreacted portions of said cobalt film that have not been turned into silicide; and conducting a second heat treatment to induce a phase transition in said silicide film at a temperature higher than the temperature set for said first heat treatment step.

17. The method for fabricating a semiconductor device of one of claims 14 to 16, wherein doping with respect to said source/drain regions is performed prior to said step of forming said cobalt silicide film.

18. The method for fabricating a semiconductor device of one of claims 14 to 16, wherein doping with respect to said source/drain regions is performed posterior to said step of forming said cobalt silicide film.

* * * * *

UNITED STATES PATENT AND TRADEMARK OFFICE
CERTIFICATE OF CORRECTION

PATENT NO.    : 6,150,248
DATED         : November 21, 2000
INVENTOR(S)   : Sekiguchi et al.

Page 1 of 1

It is certified that error appears in the above-identified patent and that said Letters Patent is hereby corrected as shown below:

Title page,
Foreign Application Priority Data section, delete "Jun. 1, 1998" and insert
-- January 6, 1998 --.

Signed and Sealed this

Thirtieth Day of October, 2001

Attest:

*Attesting Officer*

NICHOLAS P. GODICI
*Acting Director of the United States Patent and Trademark Office*